United States Patent [19]
Hofmeister

[11] Patent Number: 5,769,184
[45] Date of Patent: Jun. 23, 1998

[54] COAXIAL DRIVE ELEVATOR

[75] Inventor: Christopher A. Hofmeister, Hampstead, N.H.

[73] Assignee: Brooks Automation, Inc., Chelmsford, Mass.

[21] Appl. No.: 722,353

[22] Filed: Sep. 27, 1996

[51] Int. Cl.[6] ........................................................ B66B 9/02
[52] U.S. Cl. .......................................... 187/267; 74/89.15
[58] Field of Search ..................................... 187/210, 267, 187/268; 254/98, 92; 74/89.15, 424.8 R

[56] References Cited

U.S. PATENT DOCUMENTS

| | | | |
|---|---|---|---|
| 2,333,341 | 11/1943 | Scrivener | 451/363 |
| 3,803,927 | 4/1974 | Lawler | 74/89.15 |
| 3,805,629 | 4/1974 | Hassan et al. | 214/1 BC |
| 4,466,769 | 8/1984 | Inaba et al. | 414/744 R |
| 4,614,128 | 9/1986 | Fickler | 74/424.8 B |
| 4,643,629 | 2/1987 | Takahasi et al. | 414/331 |
| 4,682,930 | 7/1987 | Hachisu | 414/589 |
| 4,687,542 | 8/1987 | Davis et al. | 156/643 |
| 4,712,441 | 12/1987 | Abraham | 74/89.15 |
| 4,719,810 | 1/1988 | St. Cyr et al. | 74/89.15 |
| 4,739,669 | 4/1988 | Yokose et al. | 74/89.15 |
| 4,764,076 | 8/1988 | Layman et al. | 414/217 |
| 4,781,511 | 11/1988 | Harada et al. | 414/217 |
| 4,782,713 | 11/1988 | Torii et al. | 74/89.15 |
| 4,829,840 | 5/1989 | Torii et al. | 74/89.15 |
| 4,858,481 | 8/1989 | Abraham | 74/89.15 |
| 4,911,597 | 3/1990 | Maydan et al. | 414/217 |
| 4,981,408 | 1/1991 | Hughes et al. | 414/217 |
| 5,069,269 | 12/1991 | Reuter et al. | 164/325 |
| 5,111,708 | 5/1992 | Brusasco | 74/89.15 |
| 5,111,709 | 5/1992 | Torii et al. | 74/89.15 |
| 5,117,701 | 6/1992 | Thuries et al. | 74/89.15 |
| 5,128,688 | 7/1992 | West | 343/766 |
| 5,148,714 | 9/1992 | McDiarmid | 74/89.15 |
| 5,223,001 | 6/1993 | Saeki | 29/25.01 |
| 5,224,809 | 7/1993 | Maydan et al. | 414/217 |
| 5,234,303 | 8/1993 | Koyano | 414/217 |
| 5,251,500 | 10/1993 | Torii et al. | 74/89.15 |
| 5,271,702 | 12/1993 | Dobbs et al. | 414/223 |
| 5,327,795 | 7/1994 | Katahira | 74/424.8 B |
| 5,346,045 | 9/1994 | Bennett et al. | 192/141 |
| 5,540,821 | 7/1996 | Tepman | 204/192.13 |

FOREIGN PATENT DOCUMENTS

| | | |
|---|---|---|
| S37495 | 8/1956 | Germany . |
| 4316423 | 11/1994 | Germany . |
| 60-073163 | 4/1985 | Japan . |
| 2-113152 | 4/1990 | Japan . |
| 1193345 | 11/1985 | Russian Federation . |

*Primary Examiner*—Kenneth Noland
*Attorney, Agent, or Firm*—Perman & Green, LLP

[57] ABSTRACT

The present invention resides in an elevator mechanism comprising a base plate defining the bottom wall of a chamber disposed above the base plate. The base plate has a top surface and a bottom surface with an opening therein communicating between the top and bottom surfaces. A first drive is disposed below the base plate for linear movement parallel to a first given direction. A carriage is connected for movement to the first drive and carries a lift tube extended upwards from the carriage along the given direction and through the opening in the base plate. The lift tube including a coaxially disposed rotary shaft therewithin. A second drive having an output is provided and is supported on the carriage parallel to the given direction and spaced from the rotary shaft in a side-by-side orientation. A coupling is also provided for drivingly connecting the output of the second drive to the rotary shaft.

19 Claims, 9 Drawing Sheets

5,769,184

COAXIAL DRIVE ELEVATOR

FIELD OF INVENTION

The apparatus of the present invention relates generally to material transfer devices. The material transferred might include, but not be limited to, semiconductor wafers, such as Silicon and Gallium Arsenide, semiconductor packaging substrates, such as High Density Interconnects, semiconductor manufacturing process imaging plates, such as masks or reticles, and large area display panels, such as Active Matrix LCD substrates.

BACKGROUND OF THE INVENTION

The present invention relates generally to material transfer devices, and in particular, to a coaxially drive elevator used to effect rotation and vertical movement of substrate holders in material transfer devices for the production of substrates which may take the form of semiconductor wafers and or flat panels, or other substrates, or media.

The need for high throughput transport devices which can move a substrate or workpiece between remote locations within highly confined areas as defined by a limited footprint such as found in the manufacture of wafers or panels used in the semiconductor industry are in high demand. This is because in the process of manufacturing, not just in the semiconductor industry, the need to move a workpiece from one position to the next not only requires a high throughput rate, but also accuracy of repeatability of placement of workpieces in registration at predetermined orientations on a support surface. Still a further constraint is a to fabricate a positioning machine which is capable of working in a clean room environment where the existence of particulates is minimized, if not nonexistent.

Attempts have been made to fabricate elevator mechanisms which drive a transfer device coaxially top effect both vertical and rotational movement along and about a given vertical axis. One such device is disclosed in U.S. Pat. No. 4,952,299. Here, a vertically moveable frame is provided to which is secured a drive motor provided for the purpose of rotating a drive shaft 76. The drive motor is however located in line with the drive shaft which limits the stroke length of the shaft 76 given that the length of the drive motor must be accounted for. In addition, the drive shaft at its top end, connects directly to an arm so as to be incapable of independently supporting an articulated transfer mechanism of the type which the present invention is concerned, apart from rotation of the shaft 76.

Accordingly it is an object of the present invention to provide an article transfer mechanism for moving an article between first and second stations in a straight linear path with repeatability of movement and which mechanism is articulated by a drive which both rotates and vertically moves the mechanism about and along a given axis.

Still a further object of the invention is to provide an elevator mechanism of the aforementioned type which utilizes a compact drive arrangement to provide increased stroke length relative to a given housing size.

It is still a further object of the invention to provide a transport device of the aforementioned type wherein a substrate is capable of being moved as a group of stacked substrates from one position to the next or to effect greater throughput of the processing operation.

It is yet a further object of the invention to provide a transport mechanism of the aforementioned type wherein the mechanism provides a holder on which is stacked a plurality of substrates which are handled as a group and worked on by subsequent operations using the holder.

Still a further object of the invention is to provide a transport mechanism which is capable of functioning in a clean room environment.

Further objects and advantages of the present invention will become apparent from the following specification and appended claims.

SUMMARY OF THE INVENTION

The present invention resides in an elevator mechanism comprising a base plate defining the bottom wall of a chamber disposed above the base plate, the base plate having a top surface and a bottom surface with an opening therein communicating between the top and bottom surfaces. A first drive is disposed for movement parallel to a first given direction below the base plate. A carriage is connected for movement to the first drive and carries a lift tube extended upwards from the carriage along the given direction and through the opening in the base plate. The lift tube includes a coaxially disposed rotary shaft therewithin and is supported on the carriage. A second drive having an output is provided and is supported on the carriage for rotating the rotary shaft in either direction. The first drive output is disposed parallel to the given direction and spaced from the rotary shaft in a side-by-side orientation. A coupling means is also provided for drivingly connecting the output of the second drive to the rotary shaft.

The invention further resides in a rotary linear drive having a base and a linear positioning device extending in a given direction with first and second ends secured within the base. A first rotary drive is secured to the base and is drivingly coupled to the linear positioning device. A carriage is connected to the linear positioning device for movement along the given direction in response to energization and reverse energization of the first rotary drive. The carriage has a support base surface which extends generally perpendicularly to the first given direction. A lift tube is supported on the support base at the lower end thereof and has a hollow internal confine for receiving a rotary shaft therein. The rotary shaft has a length longer than the length of the lift tube so as to extend upwardly beyond one end of the lift tube and to depend downwardly therefrom and through an opening formed in the support base to define a depending connecting portion thereon. A second drive is mounted to the carriage and has an output for causing rotation of the rotary shaft. A coupling means is provided for drivingly coupling the output of the second drive to the rotary shaft for effecting rotation in either rotational direction. The ON and OFF conditions of the first and second drives being controlled by a control means.

DETAILED DESCRIPTION OF THE PREFERRED EMBODIMENTS

Figure 1:
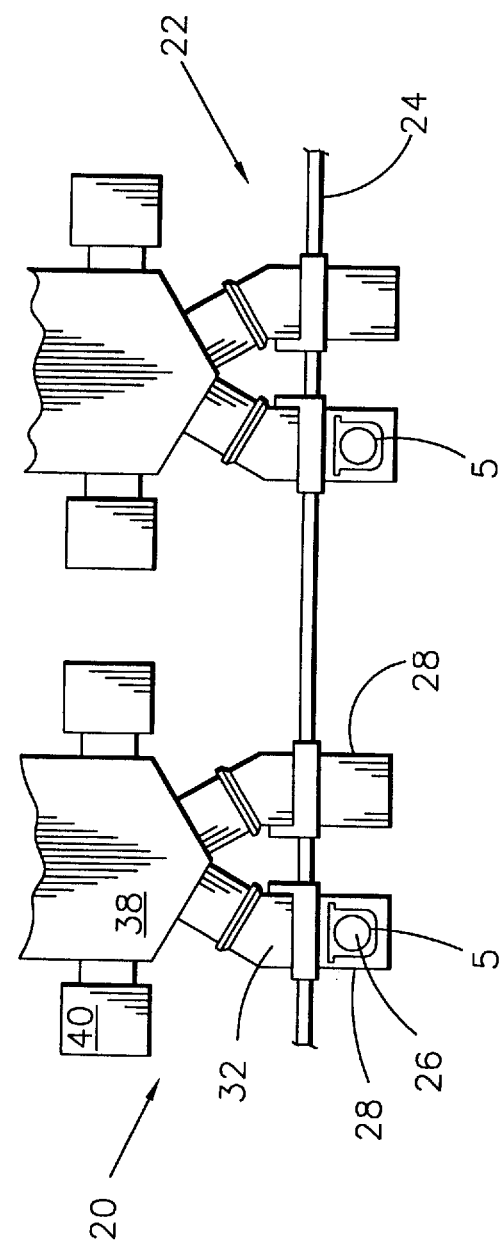
FIG. 1 is a partially fragmentary top plan diagrammatic view of a pair of side by side processing stations of the type capable of utilizing the transfer apparatus of the invention.

Turning now to the drawings, FIG. 1 illustrates a series of processing systems 20 for operating on planar substrates which may include wafers and flat panels. As noted earlier, the terms "wafer", or "substrate" will be used for purposes of consistency to refer to such substrates, but it will be understood that it is intended to be used in the broad context so as to be applicable to all substrates. The processing systems 20 may be arranged, for example, in side-by-side fashion within a "clean room" 22 separated from the outside environment by a wall 24. It may be possible to eliminate the clean room as a separate environment and, instead, maintain a desired clean environment within the system 20 and within each instrumentality which interfaces with the system.

In any case, it is customary to carry a large number of substrates or workpieces S (FIG. 2) within a cassette 26 or within a controlled environment carrier box 26'. In such instances, a plurality of the substrates are loaded into the cassette 26 or into the carrier box 26' where each is supported in a spaced, stacked, relationship, and then transported manually, or otherwise, and placed on a shelf 28 adjacent an associated system 20 to await entry for processing. The cassette is placed into a waiting chamber 30 within a load lock 32 when an entry door 34 (FIGS. 3 and 4) is opened enabling access through a load port 35 (FIG. 4). By means of a transfer device 36 which is positioned above the chamber base plate 31 and is articulated by a controller 10 to be described, a plurality of the substrates S in the cassette 26 or in the controlled environment box 26' are lifted off the shelves of the cassette or box and moved in stacked form into the chamber 30 of the load lock station 32 in one motion of the device 36. Subsequently, by means of a transport apparatus 37 disposed within a transport chamber 38 connected to the load lock 32, the substrates S are moved one by one to the transport chamber 38 and, from there, to one or more of a plurality of processing stations 40.

Figure 2:
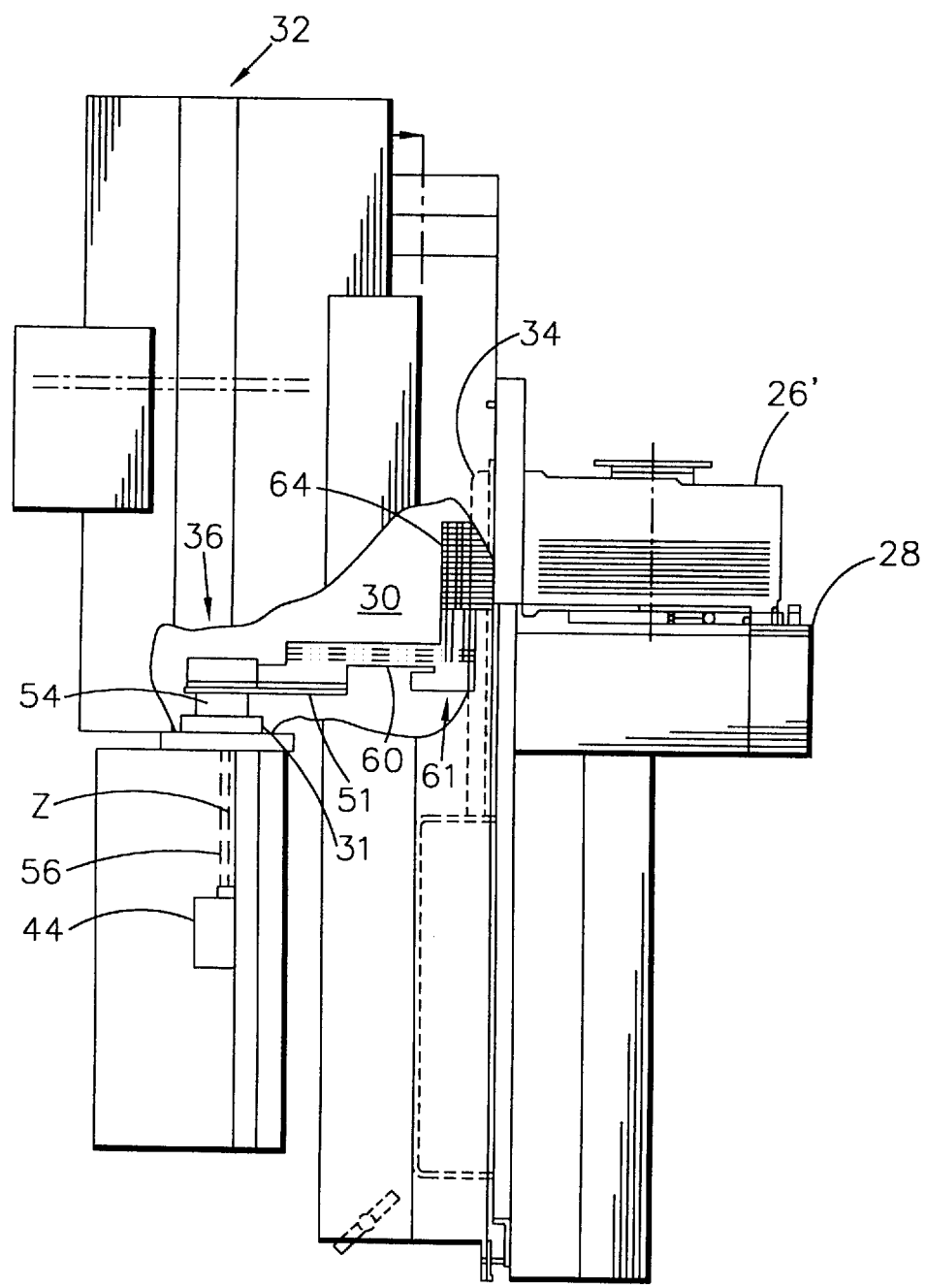
FIG. 2 is a partially fragmentary side elevation view of the processing station illustrated in FIG. 1.

As illustrated in FIGS. 2 and 4, the transfer device 36 is mounted to the top of an elevator mechanism 44 for vertical movement along the indicated Z-axis. The elevator mechanism 44 has a housing 43 and a mount 45 supported within the load lock 32 and controllably, selectively positions the device 36 at different height locations for the purpose of positioning each substrate S for engagement with the transport apparatus 37. For this purpose, as seen in FIG. 4, the elevator mechanism 44 includes a rotary shaft 56 which is disposed within a lift tube 54 responsible for moving the shaft 56 in the vertical direction along the Z-axis. At the top of the lifting tube 54 is disposed a mounting block 51 which is secured against movement to the tube 54 by an appropriate set of screws.

The transfer device 36 includes an articulated drive arm 60 pivotally connected to the mounting block 51 for rotation about the indicted axis AX. The free end 61 of the drive arm 60 in turn supports a plurality 64 of end effectors 66 thereon which are arranged in a stacked arrangement and for rotational movement about the indicated axis MX. The drive arm 60 and the end effector plurality 64 are moveable both angularly and linearly relative to the support arm 52 in order to move a stack of substrates S between the cassette support station and the chamber 30 of the load lock.

The transport apparatus 37 also includes substrate holders 33,33 which are controllably moved by instructions from the controller into and out of the load lock chambers 30,30 in order to pick up a substrate S supported on an end effector 66 within a chamber 30 and move it to one of the processing modules for processing and to thereafter place the worked on substrate back into the chamber where it is supported on one of the end effectors 66.

As illustrated, the radius R defines the stroke length of the substrate holder 33 from the transport chamber center TC which is standard. Each substrate holder 33 is complimentarily configured to mate with the shape of the end effectors 66 when moved along the radius R so as to lift a substrate S off the involved end effector when relative vertical movement therebetween is effected by the elevator mechanism 44. Thus, by angularly orienting the end effectors 66 in line with the radius R within the load lock 32, pick and place transport of the substrate S through relative vertical movement of the end effectors and the substrate holder can be achieved.

Figure 3:
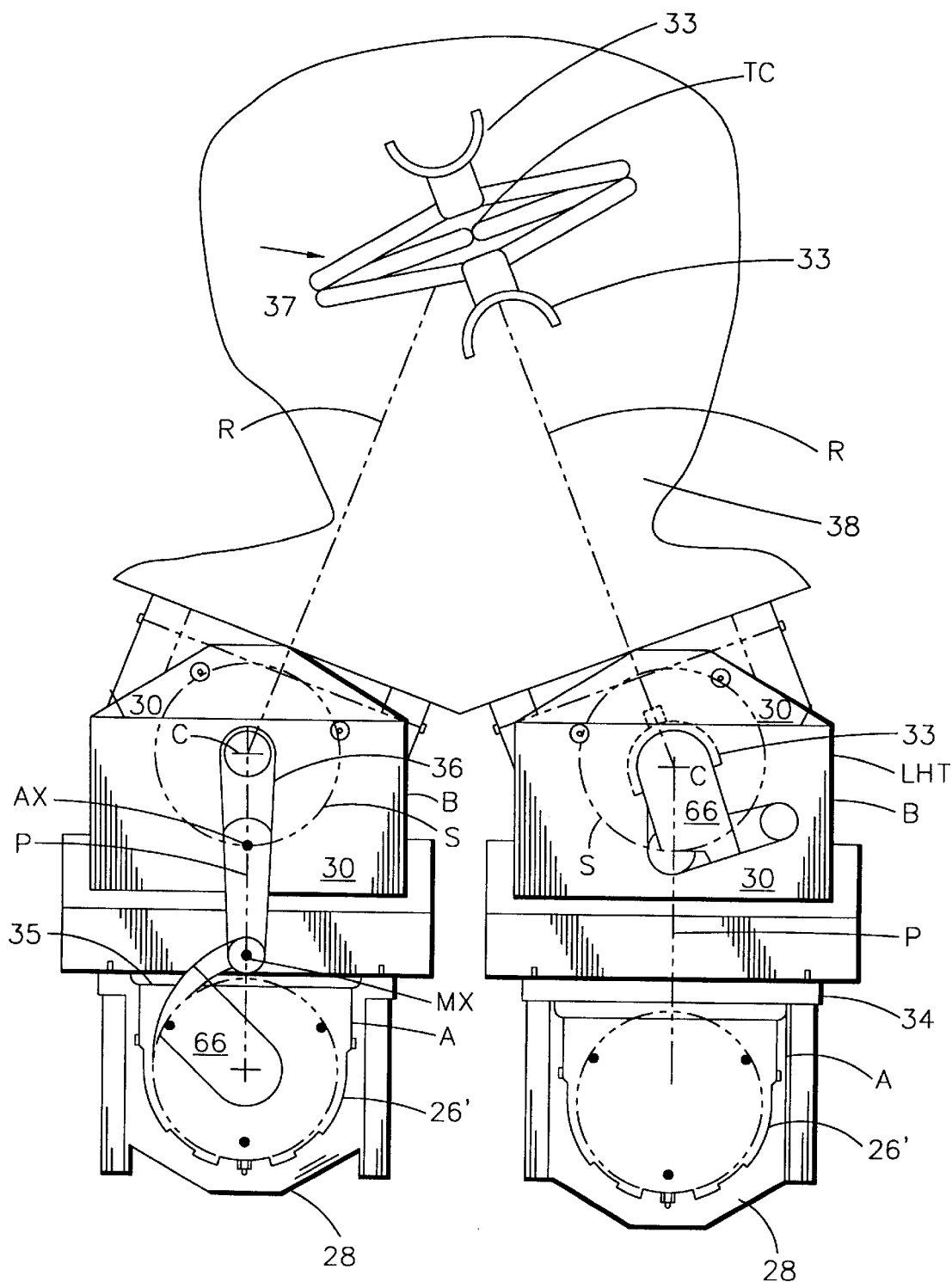
FIG. 3 is a top plan partially fragmentary diagrammatic view illustrating, in greater detail, a single one of the processing stations of FIG. 1 and utilizing a transfer apparatus embodying the invention.
Figure 4:
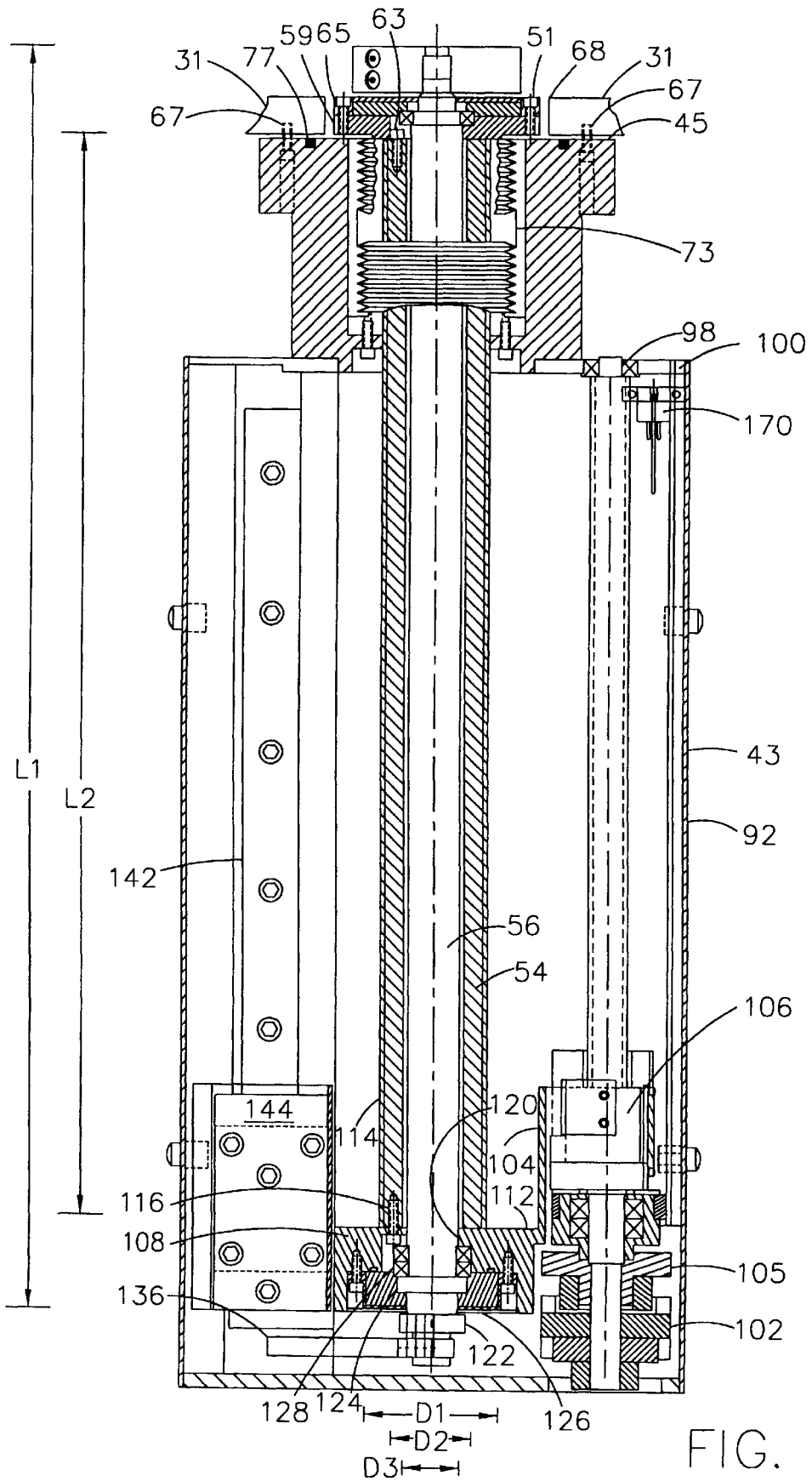
FIG. 4 is a side vertical section elevation view, certain parts being cut away for clarity, of the coaxial drive.

The transfer device 36 is capable of moving the center(s) C of the plurality of stacked substrates S (or even a single substrate) along a straight linear path as illustrated by the dashed line P extending between positions A–C in FIG. 3. The positions A and C are respectively associated with a cassette load and unload position (location A) and a transport chamber load and unload position (location B). Thus, the linear straight line P identifies the path followed by the substrate S as between the cassette 26 and the internal confines 30 of the locking station 32.

As illustrated in FIG. 4, the lift tube 54 has a collar plate 59 secured to the upper end thereof through the intermediary of set screws 63. The mounting plate 51 is secured to the end of the lift tube 54 through the intermediary of the collar plate which is connected to the mounting plate by screws 65. The mount 45 connects to the chamber base plate 31 with threaded bolts 67 which are received within threaded openings formed in the bottom surface of the plate 31. The mount 45 also includes a well 69 through which the lift tube passes. Connected to the collar plate 59 and to the bottom of the well 69, is a bellows seal 73 which is capable of axially expanding with the vertical movement of the lift tube to maintain a sealed environment within the chamber 30. An opening 68 is formed in the base plate 31 and is of a diameter sufficient to permit passage of the bellows seal 73, or like device, and the coupled lift tube therethrough. As an alternative to the bellows seal, a sliding cartridge may be used and inserted within the well 69 in engagement with upper and lower lip seals. Surrounding the opening 68 in the base plate 31 radially outwardly thereof is an annular seal 77 which is received within an annular groove formed in the face of the mount 45 which confronts the undersurface of the base plate 31.

The mounting block 51 in the illustrated manner shown in FIG. 5 rotatably supports the drive arm 60 thereon for rotation about the indicted axis AX. The free end 61 of the drive arm 60 in turn supports a plurality 64 of end effectors 66 thereon which are arranged in a stacked arrangement and for rotational movement about the indicated axis MX. Unlike the drive arm 60, the mounting block 51 is stationary except for movement in the Z-axis. The drive arm 60 and the end effector plurality 64 are however moveable both angularly and linearly relative to the block 51.

Figure 5A:
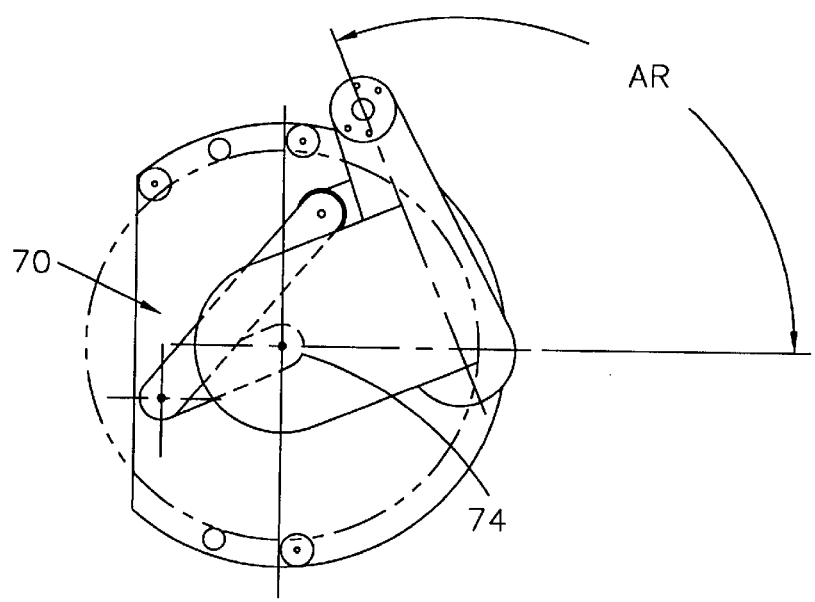
FIGS. 5a and 5b illustrate schematically the linkage of the transfer device.
Figure 5B:
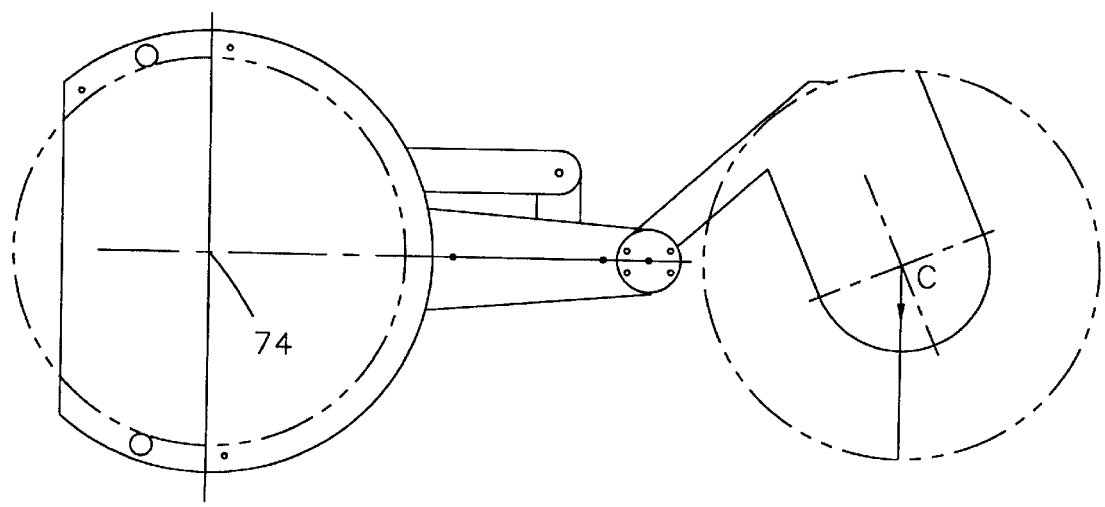

Relative movement between the drive arm 60 and the end effector plurality 64, and between these elements taken relative to the mounting block 51 is accomplished through the intermediary of an articulated linkage illustrated generally schematically at 70 in FIGS. 5*a* and 5*b*. One end of the linkage is secured to the drive arm 60 at point 71 and the other end of the linkage 70 is nonrotatably connected to the top end of the rotary shaft 56 at point 74. It should be seen that the articulated linkage 70 is comprised of a minor arm 80 and a major arm 82 which are pivotally connected to one another at a pivot joint 86. The end of the minor arm 80 which is associated with the rotary shaft 56 as illustrated in FIG. 4 has a frustoconical clamping collar 88 which engages on a correspondingly shaped surface formed on the top end of the rotary shaft 56. A securement bolt 90 is provided and when tightened, nonrotatably secures the shaft 56 to the minor arm 80. In this way, rotation of the rotary shaft 56 in a clockwise direction will cause the drive arm to sweep in a clockwise direction and rotation of the rotary shaft 56 in a counterclockwise direction will cause the drive arm to sweep in a counterclockwise direction. Rotation of the end effectors 66 is achieved by rotationally coupling the mounting shaft to which the end effectors are connected to the mounting block 51 as is best described in copending and commonly assigned U.S. application Ser. No. 08/716,943 entitled COAXIAL DRIVE LOADER ARM.

Figure 6:
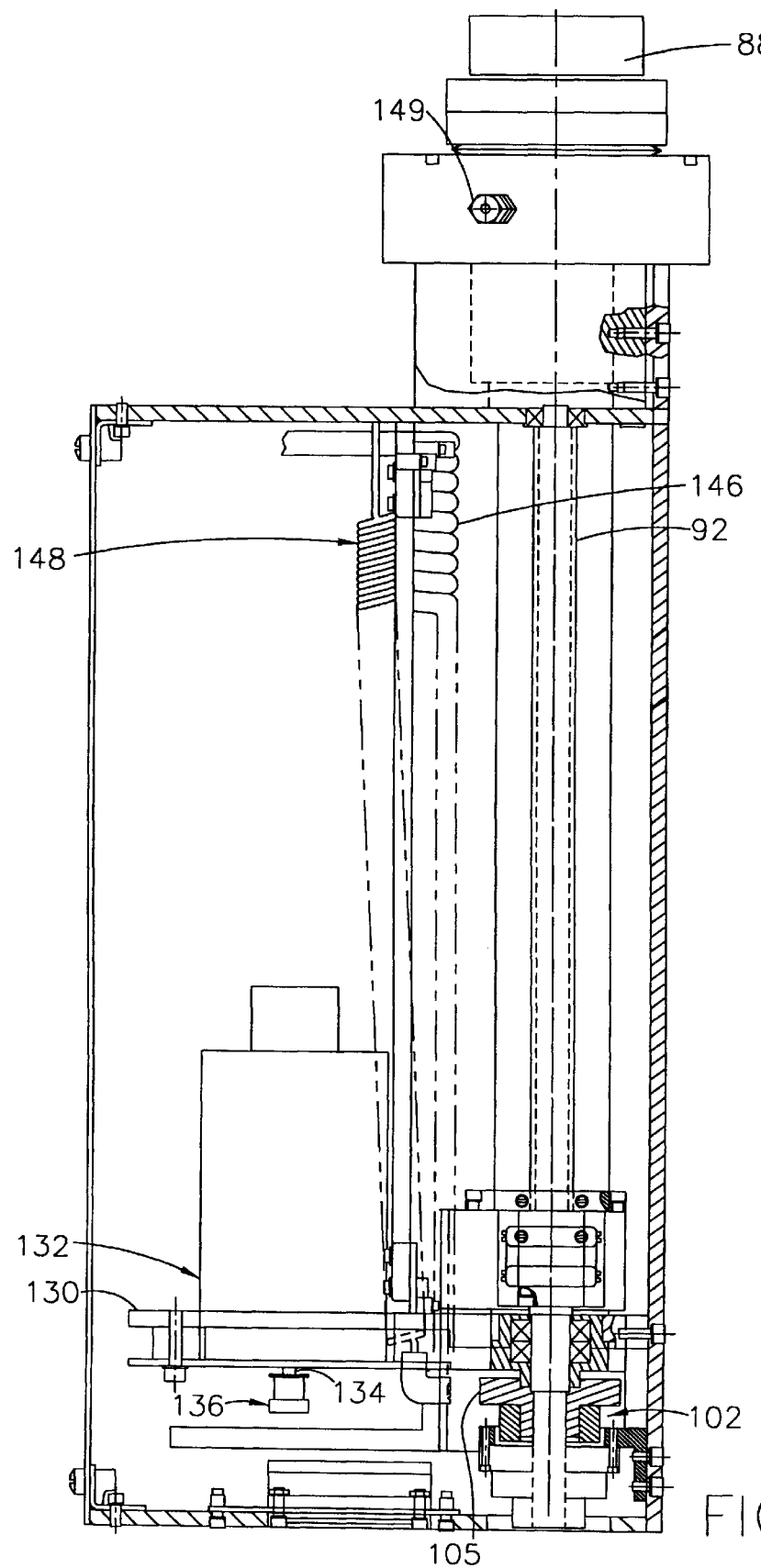
FIG. 6 is a side vertical section elevation view, certain parts being cut away for clarity, of the coaxial drive from an angle perpendicular to that shown in FIG. 4.

As illustrated in FIGS. 4 and 6, an elongated lead screw 92 is provided in the elevator mechanism 44 and extends vertically parallel to the Z-axis between the upper and the lower ends of the housing or frame 43. The upper end of the lead screw 92 is journalled for rotation within a horizontally extending portion 100 of the housing 43 and the lower end thereof is journalled for rotation within a brake assembly 102 secured to the housing 43. The lead screw 92 is drivingly rotatably coupled to a Z-axis drive motor 100 (Seen in FIG. 7) which is secured against movement to the housing 43 and controllably rotates the lead screw in either rotational direction in response to commands issued by the controller 10. A drive belt 101 is provided and engages around an output pulley 103 mounted on the motor 100 and a driven pulley 105 which is nonrotatably coupled to the lower end of the lead screw 92. Disposed for movement on the lead screw 92 is a lift carriage 104 which is threadedly coupled to the lead screw 92 by a drive nut 106 secured to the lift carriage so that rotation of the lead screw in either direction causes a corresponding upward or downward movement of the lift carriage 104.

The lift carriage has a support base 108 defining a support surface 112 thereon which extends perpendicularly to the longitudinal extent of the lead screw 92. The lower end 114 of the lift tube 56 is supported on the support surface 112 and is secured against movement thereupon by a locking screw 116 such that the lift tube moves upwards or downwards in unity with the carriage 104 in response to the energization or reverse energization of the drive motor 100. The support base has an opening 120 formed therein with a diameter D1 which is smaller than the outer diameter D2 of the lift tube, but is of a diameter somewhat larger than the diameter D3 of the rotary shaft 56. The rotary shaft 54 has a length L1 which is greater than the length L2 of the lift tube 56 so that a portion of the rotary shaft 56 extends upwards beyond the lift tube to provide a surface onto which the clamping collar 88 of the linkage 70 connects. In addition, the relative lengths are such that the lower end of the rotary shaft 54 also extends downwards beyond the lower end of the lift tube 56 and into and through the opening 120 in the support base 108, The length of the shaft 54 which depends beyond the support base 108 defines a connecting length 122 which has an annular locating member 124 clamped against axial movement to the support base 108 of the lift carriage 104 by an end plate 126. Race bearings 128 are provided and are disposed within the support base 108 to rotatably journal the lower end of the rotary shaft 56 therewithin.

As best illustrated in FIG. 6, the carriage 104 includes an integrally formed cantilevered plate portion 130 onto which is mounted a theta drive motor 132 having an output shaft 134 which extends parallel to the Z axis and is spaced therefrom in a side by side arrangement. A coupling means 136 is provided between the lowermost connecting length 122 of the output shaft 134 and the theta drive motor 132 to effect controlled rotation of the shaft 56. As will be discussed later, the coupling means can take various different forms, but for the moment it should be understood that the means 136 translates either rotary or linear movement from the theta drive motor 132 to rotate the rotary shaft 56.

The end of the carriage disposed opposite the drive nut 106 location, carries a linear bearing means 140 for movably holding and maintaining the associated end of the carriage in a perpendicular relationship to the indicated Z axis. For this purpose, the means 140 includes a way 142 which is secured within the housing 43 and extends parallel to the Z axis. A slide 144 is secured to the carriage 104 and slidingly moves along the way in a conventional manner as is known in the art. As illustrated in FIG. 6, the Z-axis and theta drive motors are connected to a power supply (not shown) through the intermediary of a coiled power cord 146 depending from the top of the housing 43. Also depending from the housing top is a vacuum line 148 which has one end connected to an external differential pump. The other end of the line 148 is connected to a passage (not shown) communicating with the internal confines of the lift tube 54 to evacuate air therefrom. A branch of the vacuum line 148 may further be connected to a duct 149 located in the collar plate 59 of the lift tube 56 and communicating with the internal confines of the lift tube.

Figure 7:
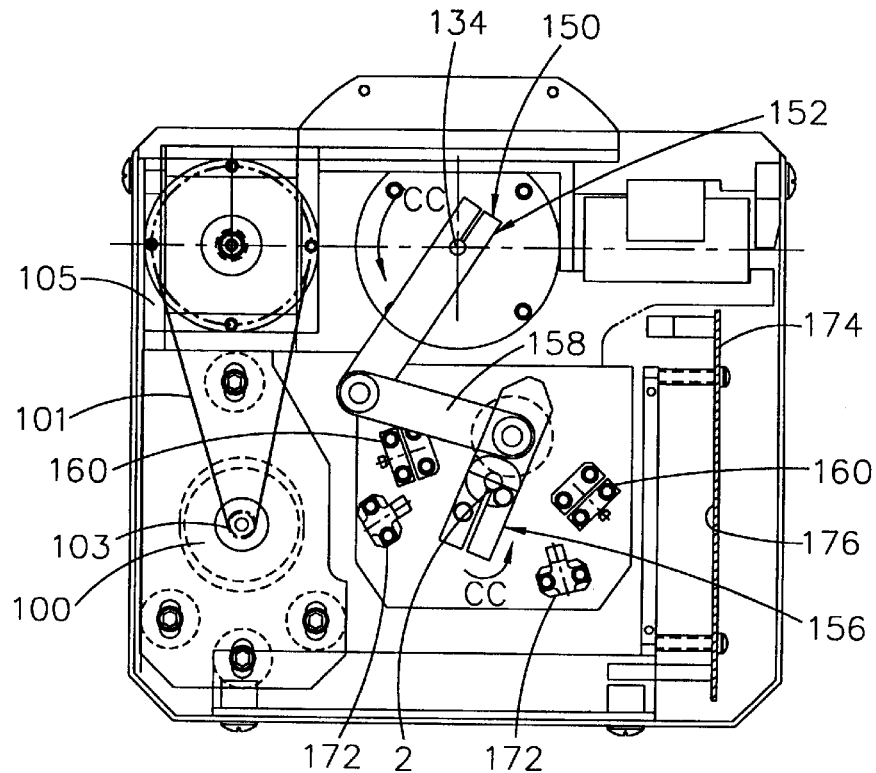
FIG. 7 is a bottom view of the elevator mechanism.
Figure 8:
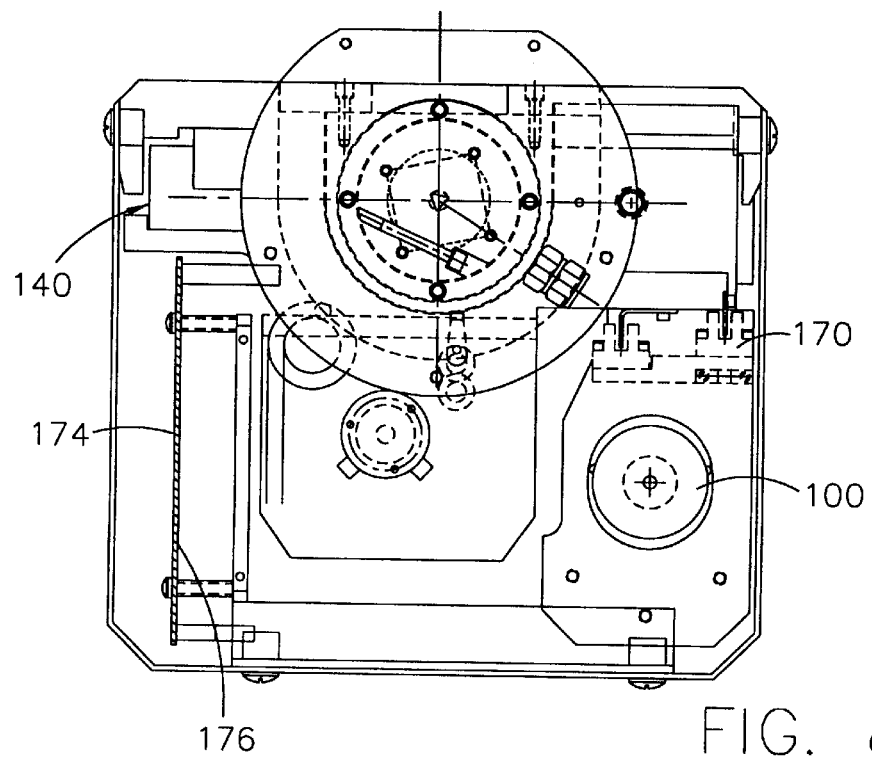
FIG. 8 is a top plan view of the elevator mechanism.
Figures 9, 10:
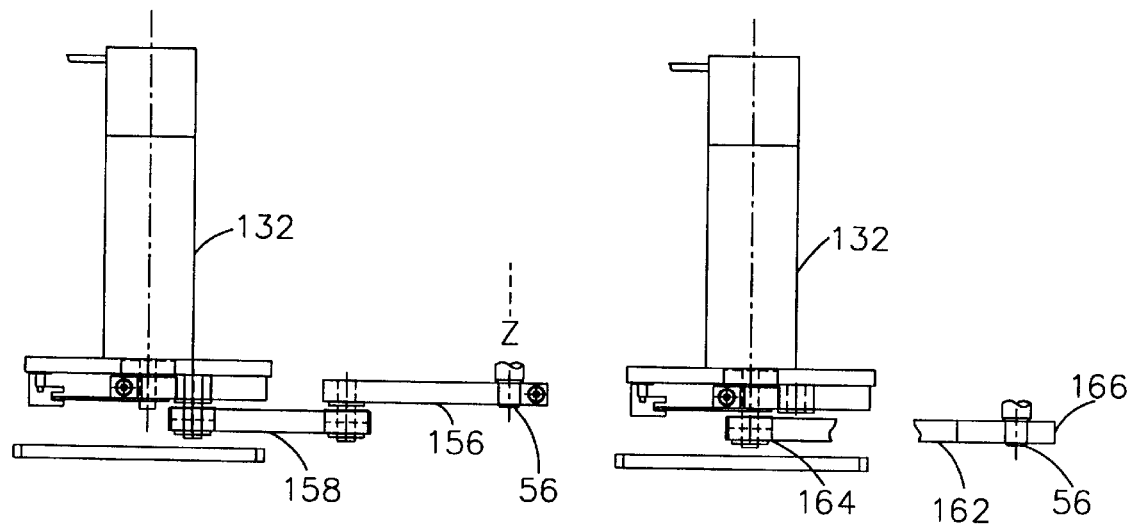
FIG. 9 is a side elevation view of a first embodiment of the theta drive coupling means as shown in FIG. 7.
FIG. 10 is a partially fragmentary side elevation view of a second embodiment of the theta drive coupling means.
Figure 11:
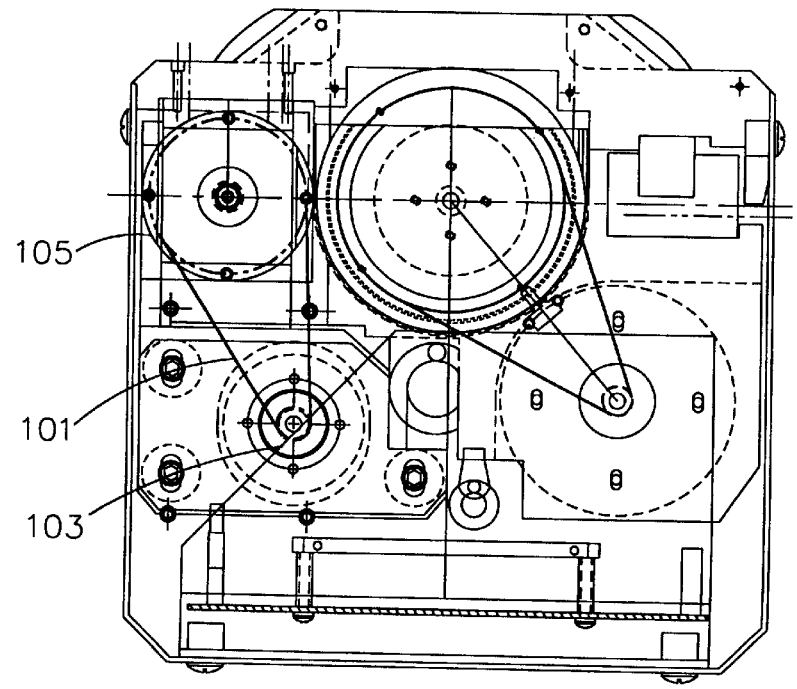
FIG. 11 is a bottom view of the drive shown in FIG. 10.

As mentioned, the coupling means 136 may take many different forms. As illustrated in FIGS. 7 and 9, in a first form, the coupling means 136 includes a three-piece linkage 150 having a first link piece 152 nonrotatably connected to a rotary output shaft 134 of the theta drive motor 132, and a second linkage piece 156 having one end nonrotatably connected to the depending end length 122 of the rotary shaft 56 and another end pivotally connected to a third link piece 158 whose other end pivotally connects to the free end of the second linkage piece 156. In this way, rotary movement CC of the output shaft 154 causes a resultant rotation CC of the rotary shaft 56 and vice versa. As discussed above, movement of the rotary shaft 56 is limited to an arc AR (See FIG. 5*a*), and therefore limit stops 160 are provided which act against the linkage piece 156 for this purpose. Alternatively, as seen in FIGS. 10 and 11, the coupling means 136 may take the form of a drive belt 162 which is trained about a drive pulley associated with the theta drive 132 and a driven pulley 166 associated with the rotary shaft 56.

Figure 12:
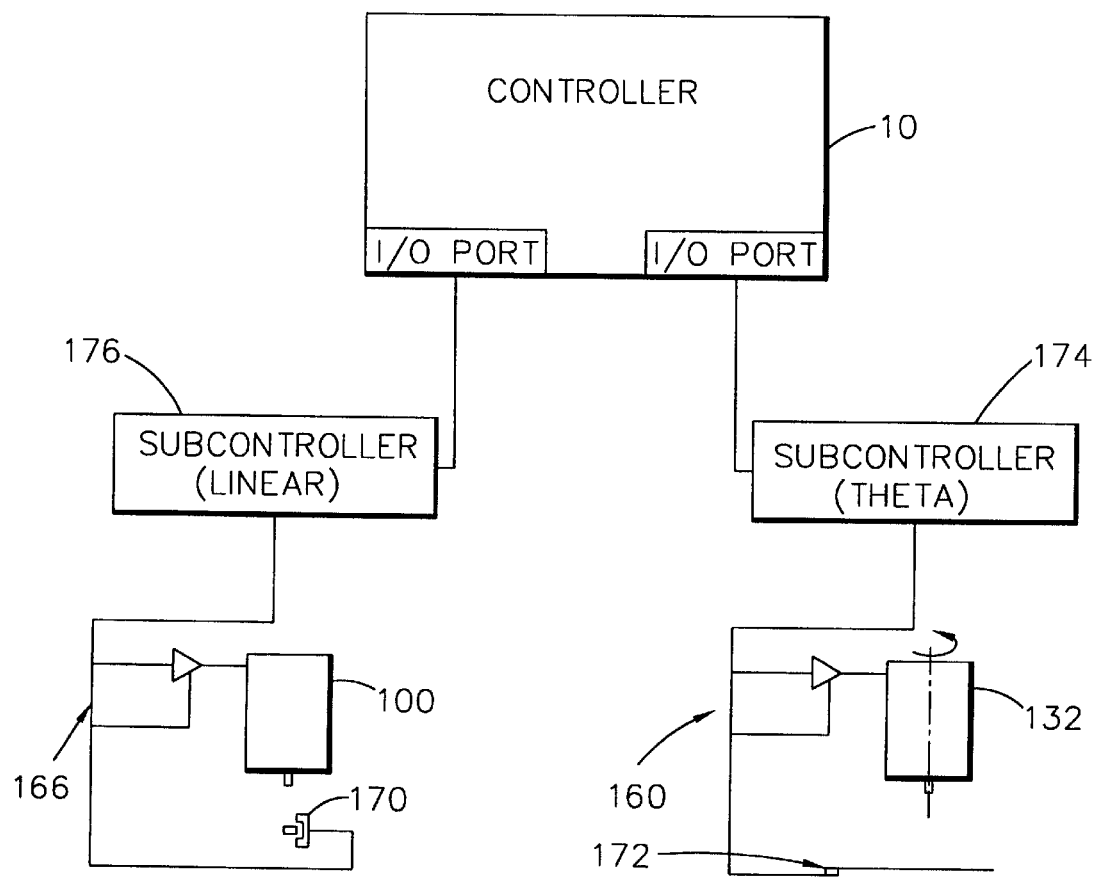
FIG. 12 is a schematic of a control system usable with the invention.
Figure 13:
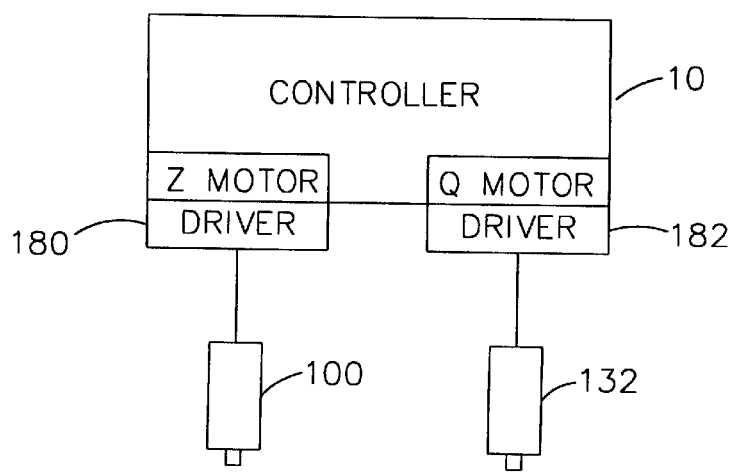
FIG. 13 is a schematic of another control system usable with the invention.

Referring now to FIGS. 12 and 13, it should be seen that the control system for controllably rotatably and vertically positioning the rotary shaft 56 and for vertically positioning the lift tube 54 about the Z axis may take two forms. In the form shown in FIG. 12, each of the Z-axis and theta motors 100 and 132, respectively, is a servo motor which employs a servo drive feedback loop 166 connected with the controller 10 to position the moved elements angularly and vertically without hands on control of the motors 100 and 132 by the controller 10. For this purposes, sensors 170 are provided on the housing and sense the vertical position of the lift carriage 104 while angular position sensors 172 are provided to sense the angular position of the rotary shaft 54 and each is connected to an its associated feedback loop 166. The carriage 104 carries subcontroller panels 174 and 176 for each of the loops. Alternatively, as illustrated in FIG. 13, the drive motors 100 and 132 used may be stepper motors, and driven by commands directly from the controller 10 from drivers 180 and 182 in an open loop type system.

By the foregoing an improved transport apparatus has been described by way of the preferred embodiments. However numerous modifications and substitutions may be had without departing from the spirit of the invention. In particular, the invention is described with reference to counterclockwise/clockwise, vertical, horizontal and other angular labelling. However, such labels are used only for purposes of explanation, and are not to be taken to limit the scope of the invention to these orientations. Also, the theta drive motor 132 may take the form of the pneumatic actuator having a sliding piston moveable between first and second positions which can be directly linked to a bell crank on the lower end of the rotary shaft 56. In such an arrangement, it would be advantageous to employ an open loop control system to effect the ON and OFF controls of the drive motor. Additionally, the coaxial drive may be usable in other applications, not necessarily limited to substrate handling.

Accordingly, the invention has been described by way of illustration rather than limitation.

What is claimed is:

1. An elevator mechanism comprising:
   a base plate defining the bottom wall of a chamber disposed above the base plate, said base plate having a top surface and a bottom surface with an opening therein communicating between said top and bottom surfaces;
   a first drive disposed for movement below said base plate and parallel to a first given direction;
   a carriage connected for movement with said first drive and carrying a lift tube extending upwards from said carriage along said given direction and through said opening in said base plate;
   said lift tube including a coaxially disposed rotary shaft therewithin;
   a second drive having an output, said second drive being supported on said carriage in a side-by-side orientation in relationship to the rotary shaft for rotating said rotary shaft in either direction; and
   coupling means connecting the output of said second drive to said rotary shaft.

2. An elevator as defined in claim 1 further characterized by said first drive having an elongated lead screw having first and second ends, the longitudinal extent of said lead screw extending between said first and second ends and parallel to said rotary shaft, said first end thereof being secured to the base plate and the second end thereof being secured to a location below said base plate.

3. An elevator mechanism as defined in claim 1 further characterized by said coupling means being a multi-piece pivot linkage.

4. An elevator mechanism as defined in claim 1 further characterized by said coupling means being a drive belt which is trained around a pulley connected to an output shaft of said second drive and another pulley which is connected to the rotary drive shaft.

5. An elevator mechanism as defined in claim 2 further characterized in that said first drive is secured to a mount which includes a well and said lift tube has a collar plate for supporting a transfer device for vertical movement thereon.

6. An elevator mechanism as defined in claim 5 further characterized by a bellow seal extending from the bottom of said well upwardly to the collar plate of said lift tube, said opening in said base plate having a diameter sufficient to permit the outer diameter of said bellow seals to move therebetween without interference.

7. An elevator mechanism as defined in claim 5 further characterized by said collar plate being connected to a mounting block which supports said transfer device thereon, said rotary shaft having a length which is longer than the length of said lift tube so as to have an upper end portion which extends upwardly beyond said lift tube, said upper end portion of said rotary shaft being connected to a linkage responsible for articulating the transfer device between first and second given positions.

8. An elevator mechanism as defined in claim 7 further characterized by said carriage having a drive nut secured thereto and threadably engaged about said lead screw secured thereto.

9. An elevator mechanism as defined in claim 8 further characterized by a differential pump by communicating between a space between said rotary shaft and said lift tube.

10. An elevator mechanism as defined in claim 3 further characterized by said first and second drives being servo motors and linked to a controller through a servo loop.

11. An elevator mechanism as defined in claim 3 further characterized by said first and second drives being stepper motors linked to a controller through an open loop.

12. An elevator mechanism as defined in claim 4 further characterized by said first and second drives being servo motors and linked to a controller through a servo loop.

13. An elevator mechanism as defined in claim 4 further characterized by said first and second drives being stepper motors linked to a controller through an open loop.

14. An elevator mechanism as defined in claim 2 further characterized by said second end of said lead screw being journalled within a brake assembly.

15. A rotary linear drive comprising:
   a base;
   a linear positioning device extending in a given direction and having a first and second ends secured within said base;
   a first rotary drive, said rotary drive being secured to said base and drivingly coupled to said linear positioning device;
   a carriage connected to said linear positioning device for movement along said given direction in response to energization and reverse energization of said first rotary drive;
   said carriage having a support base surface which extends generally perpendicularly to said first given direction;
   a lift tube supported on said support base at the lower end thereof and having a hollow internal confine for receiving a rotary shaft therein;
   said rotary shaft having a length longer than the length of said lift tube so as to extend upwardly beyond one end of said lift tube and to depend downwardly therefrom and through an opening formed in said support base to define a depending connecting portion thereon;

a second drive mounted to said carriage and having an output for causing rotation of said rotary shaft;

a coupling means for drivingly coupling the output of said second drive to the rotary shaft for effecting rotation in either rotational direction; and control means for controlling the ON and OFF conditions of said first and second drives.

16. A drive as defined in claim 15 further characterized by said first and second drives being servo motors and said control means having a controller linked to the first and second drives through a servo loop.

17. A drive as defined in claim 15 further characterized by said first and second drives being stepper motors and said control means having a controller linked to the first and second drives through an open loop.

18. A drive as defined in claim 15 further characterized by said first and second drives being servo motors and said control means having a controller linked to the first and second drives through a servo loop.

19. A drive as defined in claim 15 further characterized by said first and second drives being stepper motors linked to a controller through an open loop.

* * * * *